(12) United States Patent
Jacobs et al.

(10) Patent No.: US 6,815,699 B2
(45) Date of Patent: Nov. 9, 2004

(54) LITHOGRAPHIC APPARATUS AND DEVICE MANUFACTURING METHOD

(75) Inventors: Hernes Jacobs, Eindhoven (NL); Harmen Klaas Van Der Schoot, Vught (NL); Petrus Matthijs Henricus Vosters, Bladel (NL); Ton De Groot, Someren (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/314,447

(22) Filed: Dec. 9, 2002

(65) Prior Publication Data

US 2003/0132400 A1 Jul. 17, 2003

(30) Foreign Application Priority Data

Dec. 11, 2001 (EP) .............................. 01310332

(51) Int. Cl.$^7$ ................................ G21K 5/10
(52) U.S. Cl. .................. 250/492.22; 355/67; 430/4; 310/40 MM
(58) Field of Search ................... 250/492.2, 492.22; 355/53, 67; 430/30, 4; 310/40 MM

(56) References Cited

U.S. PATENT DOCUMENTS

| | | | |
|---|---|---|---|
| 5,646,464 A | * | 7/1997 | Sickafus ............... 310/40 MM |
| 6,211,599 B1 | * | 4/2001 | Barnes et al. ............... 310/309 |
| 6,222,614 B1 | | 4/2001 | Ohtomo |
| 6,633,366 B2 | * | 10/2003 | de Jager et al. .............. 355/67 |
| 2001/0006762 A1 | | 7/2001 | Kwan et al. |

FOREIGN PATENT DOCUMENTS

EP  0 502 578  9/1992

* cited by examiner

Primary Examiner—John R. Lee
Assistant Examiner—Zia R. Hashmi.
(74) Attorney, Agent, or Firm—Pillsbury Winthrop LLP

(57) ABSTRACT

A lithographic projection apparatus, in which movement of a substrate table in a plane is accomplished by a planar magnetic positioning device, has a mechanical limiter that limits rotation of the substrate table about a direction orthogonal to the plane.

18 Claims, 4 Drawing Sheets

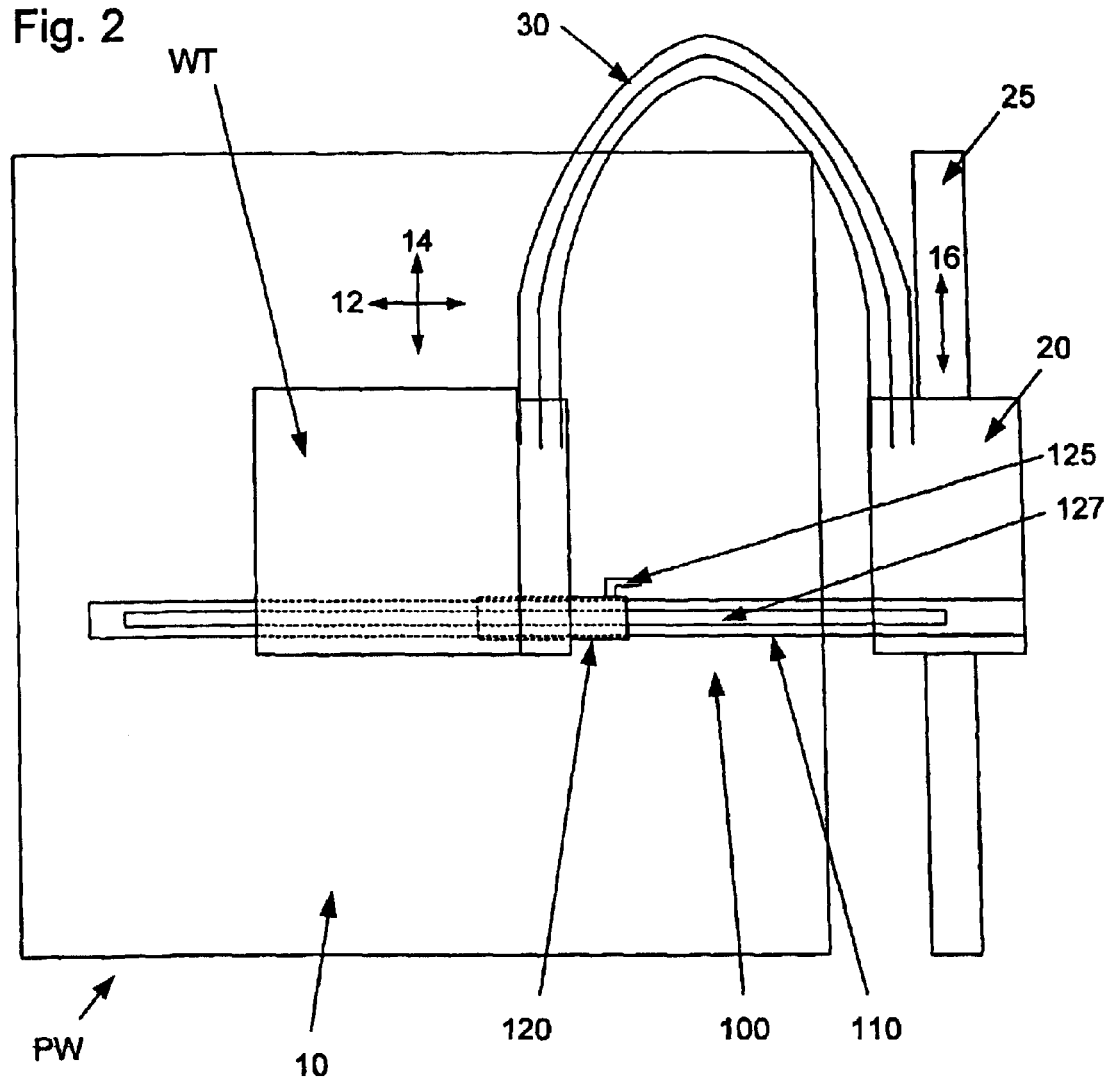

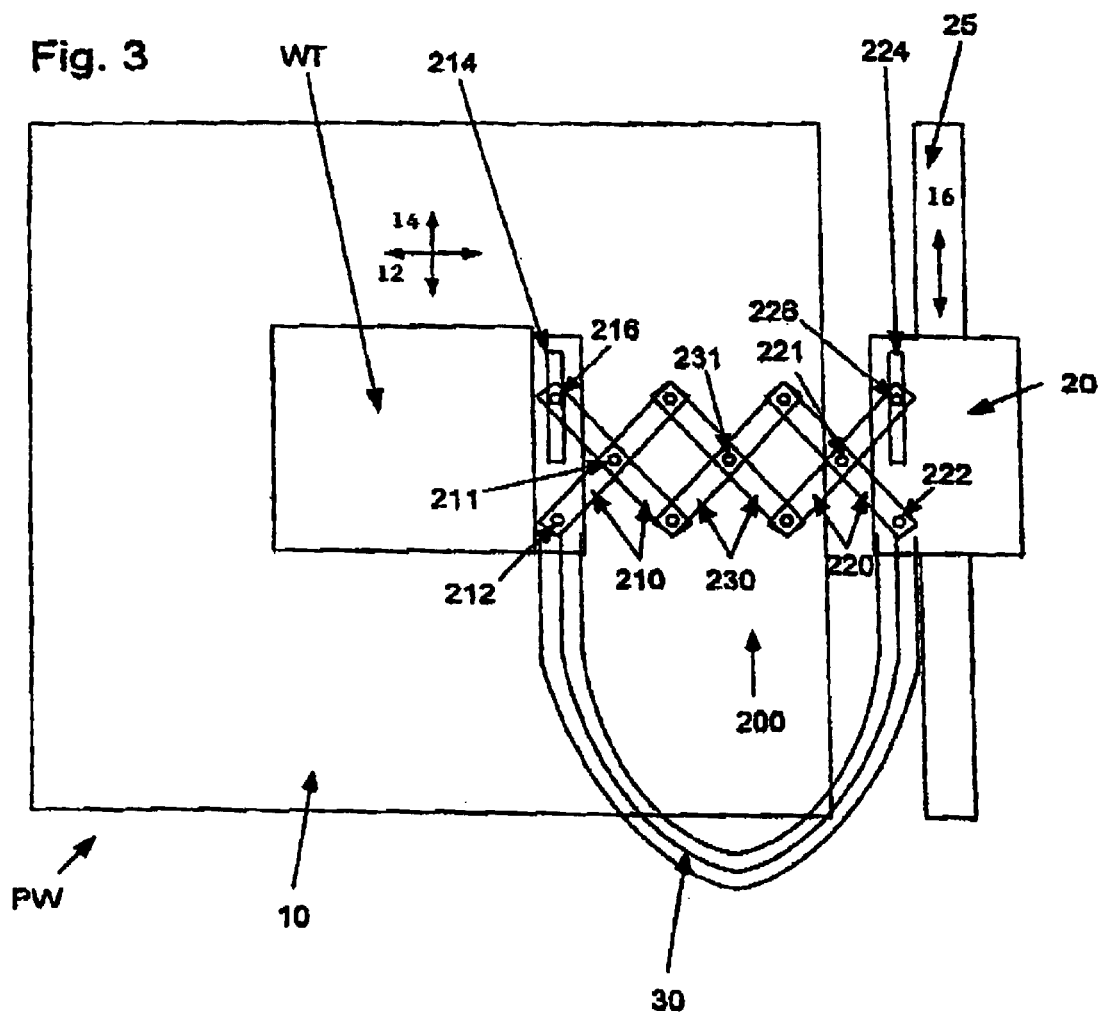

LITHOGRAPHIC APPARATUS AND DEVICE MANUFACTURING METHOD

RELATED APPLICATION

This application claims the benefit of priority to European Patent Application No. 01310332.0, filed Dec. 11, 2001, the contents of which are herein incorporated by reference.

BACKGROUND OF THE INVENTION

1. Field of the Invention

The present invention relates to a lithographic projection apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791 U.S. Pat. No. 6,262,796.

In order accurately to position the wafer in a plane in a lithographic projection apparatus, a displacement device, such as the one disclosed in WO 01/18944, may be used. The displacement device disclosed is a planar magnetic positioning device including a stator having a plurality of magnets in an X-Y plane of an orthogonal X-Y-Z axis system and an electric coil system in the base of the substrate table with two types of electric coils, one type having an angular offset of +45 degrees, and the other having an offset of −45 degrees with respect to the x-direction. The magnets of the x-y plane are arranged in rows and columns according to a Halbach array, i.e. the magnetic orientation of successive magnets in each row and each column rotates 90° counterclockwise. The substrate table may be positioned by driving current through the electric coil system.

A problem has been found with planar magnetic positioning devices in general, and the planar magnetic positioning device disclosed in U.S. Pat. No. 6,531,793 in particular, in that such systems require certain spatial relationships between the direction of polarization of the magnets of the stator and the substrate table which, if not satisfied, result in the positioning device being unable to locate the substrate table. Furthermore, if the slider is rotated 45° to the X-axis, each coil of the substrate table will be aligned with both north and south poles or the magnets of the planar magnetic positioning device and thus, any current through those coils will generate equal and opposite forces, resulting in no movement Thus, a disadvantage of using such positioning devices is that should the substrate table become misaligned by rotation about the Z-axis (Rz) as a result of, for example, a computer crash, power failure, software bug or programming error, it is nor possible to recover control of the substrate table automatically. Such large rotations are also deleterious to the conduits (i.e. power cords, signal carriers and gas tubes, etc.) which are connected to the substrate table to supply it with utilities (e.g. power, gas, control signals, etc.) because of large mechanical loads applied to those conduits.

SUMMARY OF THE INVENTION

It is an aspect of the present invention to provide a lithographic projection apparatus with a planar magnetic positioning device that allows automatic self recovery and minimizes mechanical loads on conduits attached to the substrate table.

This and other aspects are achieved according to the invention in a lithographic apparatus including a radiation system constructed and arranged to supply a projection beam of radiation; a support structure constructed and arranged to support a patterning device, the patterning device constructed and arranged to pattern the projection beam according to a desired pattern; a substrate table to hold a substrate; a projection system constructed and arranged to project the patterned beam onto a target portion of the substrate; a planar magnetic positioning device constructed and arranged to position the substrate table in a plane; and a mechanical limiter constructed and arranged to limit rotation of the substrate table about axes orthogonal to the plane.

The mechanical limiter allows the substrate table to move freely in the X and Y directions but prevents the substrate table from rotating about the Z-axis beyond a certain allowed limit and can thus prevent the substrate table from rotating so far that control of the substrate table by the positioning device is no longer possible. Thus, during a crash of the substrate table, for example after computer or power failure, large loads on the conduits attached to the substrate table are substantially prevented and control of the substrate table may be recovered automatically.

The mechanical limiter may be attached at one end to the substrate table and at another end to an actuator moveable with one degree of freedom in the plane. This can reduce deleterious interactions between the substrate table and the mechanical limiter. Advantageously, this allows utilities to be provided through conduits to the substrate table, the conduits extending between the actuator and the substrate table. The term "conduit" as used herein refers to the "umbilical cord" which generally connects the substrate table to the outside frame (e.g. a metrology frame) which carries such items as power cords, signal carriers, gas tubes (e.g. for supplying gas to a gas bearing in the table), coolant tubes, etc. Thus, the actuator may be used for several different purposes.

According to a further aspect of the invention there is provided a device manufacturing method including providing a substrate that is at least partially covered by a layer of radiation-sensitive material; holding the substrate on a substrate table; positioning the substrate table in a plane using a planar magnetic positioning device; providing a projection beam of radiation using a radiation system; using a patterning device to endow the projection beam with a pattern in its cross-section; projecting the patterned beam of radiation onto a target portion of the layer of radiation-sensitive material; and limiting rotation of the substrate table about axes orthogonal to the plane using a mechanical limiter.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm) as well as particle beams, such as ion beams or electron beams.

BRIEF DESCRIPTION OF THE DRAWINGS

Embodiments of the present invention will now be described, by way of example only, with reference to the accompanying schematic drawings in which:

FIG. 2 depicts in plan view a substrate table and planar magnetic positioning device according to an exemplary embodiment of the present invention;

FIG. 3 depicts in plan view a substrate table and planar magnetic positioning device according to another exemplary embodiment of the present invention.

In the Figures, corresponding reference symbols indicate corresponding parts.

DETAILED DESCRIPTION

Figure 1:
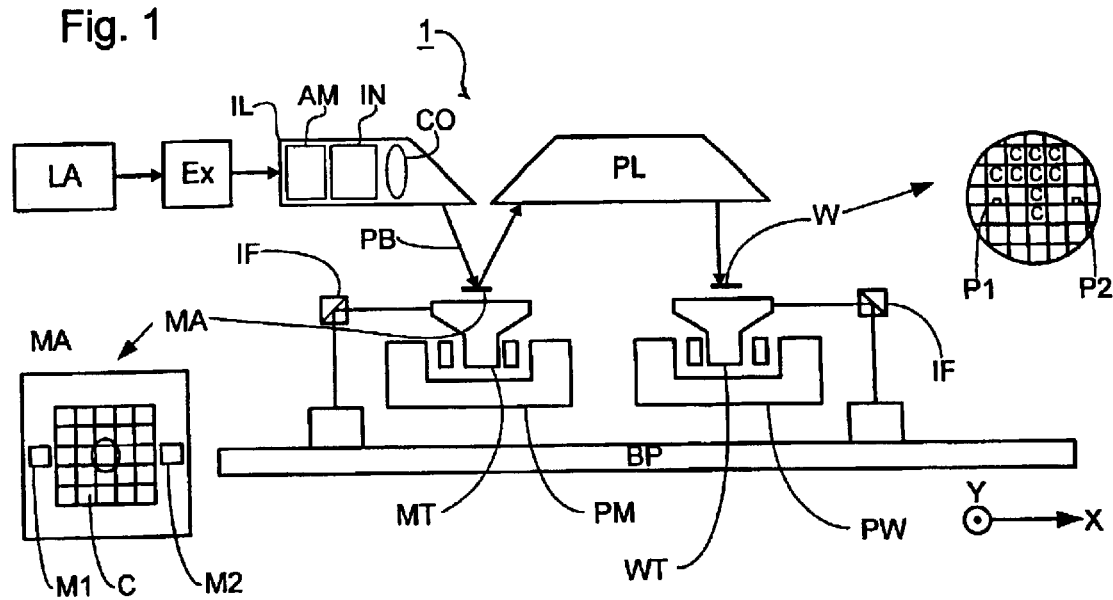
FIG. 1 depicts a lithographic projection apparatus according to an embodiment of the present invention.

FIG. 1 schematically depicts a lithographic projection apparatus 1 according to an embodiment of the invention. The apparatus 1 includes a base plate BP; a radiation system Ex, IL constructed and arranged to supply a projection beam PB of radiation (e.g. EUV radiation), which in this particular case also comprises a radiation source LA; a first object table (mask table) MT provided with a mask holder that holds a mask MA (e.g. a reticle), and connected to a first positioning device PM that accurately positions the mask with respect to a projection system or lens PL; a second object table (substrate table) WT provided with a substrate holder that holds a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

FIG. 2 illustrates the substrate table WT and the second positioning device PW in more detail. The second positioning device PW is a planar magnetic positioning device having a stator 10 comprising a plurality of magnets (not illustrated) arranged in rows and columns in a single plane. The magnets in the stator 10 may be arranged according to a Halbach array, i.e. the magnetic orientation of successive magnets in each row and each column rotates 90° counter-clockwise. The substrate table WT is provided with an electric coil system in its base. The electric coil system comprises two types of coils, one type having an angular offset of +45°, and the other having an offset of −45° with respect to the checker board configuration of the magnets. The substrate table WT may be moved relative to the stator 10 by driving current through the electric coil system in the base of the substrate table WT.

A mechanical limiter 100 limits rotation of the substrate table WT about a direction orthogonal to the stator 10. As shown in FIG. 2, reference number 12 denotes the X-axis and reference number 14 denotes the Y-axis and the mechanical limiter 100 limits rotation around the Z-axis (i.e. Rz).

The mechanical limiter 100 includes an actuator 20 which moves in a direction 16 in the plane of the stator 10. The actuator 20 moves in direction 16 which is parallel to the Y-axis 14 along a guide or track 25. An elongate member 110 is fixedly attached to the actuator 20. A sleeve 120 which at least partly surrounds the elongate member 110 is fixedly attached to the substrate table WT. The sleeve 120 is slidable along the elongate member 110.

In use, movement of the substrate table WT in the X-direction 12 results in the sleeve 120 sliding along the elongate member 110. If the substrate table WT moves in the Y-direction, the actuator 20 is also moved a corresponding amount in the Y-direction 14 so that the substrate table WT may move freely unhindered by the mechanical limiter 100. This is achieved by having a sensor for measuring the position of the actuator 20 with respect to the substrate table WT and which initiates the actuator 20 to follow the substrate table WT in the Y-direction.

The substrate table WT can be moved by the second positioning device PW without interference from the mechanical limiter 100. Frictionless bearings such as air bearings may be used between the sleeve 120 and the elongate member 110.

The mechanical limiter 100 may be provided with incremental or linear encoders 125, 127 to aid in alignment and control of the substrate table WT. Only one encoder is illustrated in FIG. 2. The encoder is of an interferometer type consisting of a sensor 125 attached to the sleeve 120 and a diffraction grating 127 attached to the elongate member 110. Other types of encoders, such as rotational potentiometers, can be used and the position in the Y-direction may also be measured. The position at which the encoders are fixed may also be different.

Should the substrate table WT experience a rotational force about the Z-axis, engagement of the sleeve 120 and the elongate member 110 will substantially prevent rotation of the substrate table WT. Upon rotation of the substrate table WT around the Z-axis, each end of the sleeve 120 will come in contact on opposite sides of the elongate member 110. The amount of rotation of the substrate table WT about the Z-axis allowed before rotation is stopped by the mechanical limiter 100 may be adjusted by a choice of the length of the sleeve 120 in the elongate direction of the elongate member 110 and by a choice of difference in external dimension of the elongate member 110 and the internal dimension of the sleeve 120. Alternatively, the elongate member 110 and sleeve 120 may be attached such that some limited rotation relative to the actuator 20 or substrate table WT is possible. The mechanical limiter 100 may be designed to substantially prevent any rotation or may be designed to allow for rotation of up to 3°, 5° or 10°. Software may be provided to limit the rotation around the Z-axis. However, mechanical solutions may also be provided as software may fail.

Conduits 30 provide the substrate table WT with utilities. The conduits 30 may be attached between the substrate table WT and the actuator 20. In an alternative embodiment, the conduits 30 may be guided by the mechanical limiter 100 from the actuator 20 to the substrate table WT. In this way large mechanical loads on the conduits 30 can be substantially prevented as only one degree of freedom of the conduits is then required. The actuator 20 may be mounted on the track 25 and driven by a suitable device, such as a liner electric motor or a worm drive.

Referring to FIG. 3, a mechanical limiter 200 includes at least one pair of crossed elongate arms 210, 220, 230. Each pair of crossed elongate arms are pivoted relative to each other at a median portion 211, 221, 231.

A first pair 210 of the at least one pair of crossed elongate arms is an outer pair of elongate arms. An outer end 212 of one arm of the outer pair of arms 210 is rotatably attached to the substrate table WT. An outer end 216 of the other elongate arm of the pair 210 is in sliding engagement with a slot 214 in the substrate table WT. The slot 214 is parallel to the Y-axis 14.

A second pair 220 of the at least one pair of crossed elongate arms is an outer pair of elongate arms. An outer end 222 of one arm of the outer pair of arms 220 is rotatably attached to the actuator 20. An outer end 226 of the other elongate arm of the pair 220 is in sliding engagement with a slot 224 in the actuator 20. The slot 224 is parallel to the slot 214 on the substrate table WT.

Between the first pair 210 and the second pair 220 of crossed elongate arms, a third pair 230 of elongate arms is situated. The ends of the elongate arms of the first pair 210 and the second pair 220 not attached to the substrate table or actuator 20, are attached to ends of the elongate arms of the third pair 230.

The invention also works with only a single pair of elongate arms in which case one end of each elongate arm will be attached to the actuator 20 and the other end to the substrate table WT. Alternatively only two pairs may be used, or any other number.

In use, the mechanical limiter 200 is similar to the mechanical limiter 100 for movement in the Y-direction. For movement of the substrate table WT in the X-direction, the pairs of crossed elongate arms 210, 220, 230 pivot relative to each other in a scissor action to extend and retract. The ends 216, 226 engaged in slots 214 and 224 (which are parallel) allow this freedom to expand and contract and ensure that the limiter 200 can limit rotation.

Dimensioning of the thickness of the elongate slots 214, 224 and the engagement portion of ends 216, 226 results in the desired degree of rotatability of the substrate table WT before limitation of rotation.

The limiter 200, and the limiter 300 described below, may also have incremental or linear encoders attached to substrate table WT or the mechanical limiter 200, 300 (or the actuator in the case of the limiter 200) to measure the position of the substrate table WT and may have conduits 30 guided by the mechanical limiter 200, 300 to the substrate table WT.

Figure 4A:
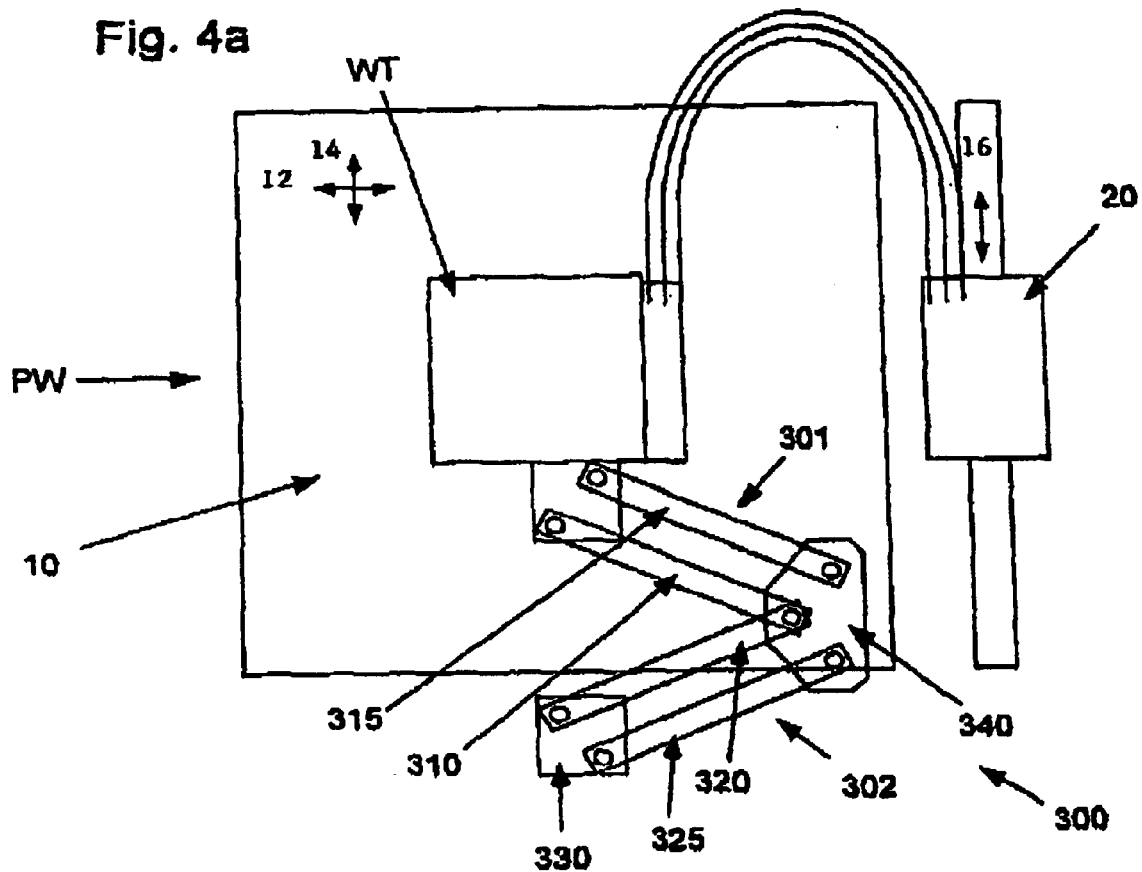
FIGS. 4a and 4b depict in plan view a substrate table and planar magnetic positioning device according to still another exemplary embodiment of the present invention.
Figure 4B:
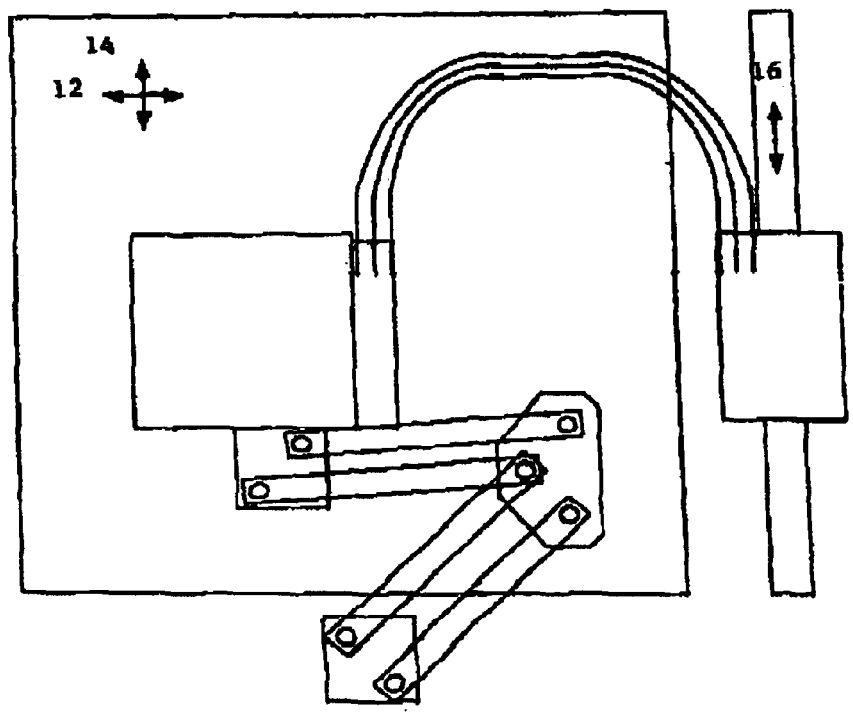

Referring to FIGS. 4a and 4b, a mechanical limiter 300 may be used in a lithographic apparatus having only one substrate table WT. The range of movement of the single substrate table WT in such an apparatus is small compared to the range of movement required of the substrate tables WT in an apparatus with dual substrate tables WT. Thus, the mechanical limiter 300 is more suited to an apparatus with only a single substrate table WT.

The difference in the mechanical limiter 300 and the mechanical limiters 100 and 200 is that one end of the mechanical limiter 300 is fixed in a position relative to the stator 10 of the second positioning device PW rather than being movable in a direction of the plane of the stator 10. The required two degrees of freedom of the end of the mechanical limiter 300 attached to the substrate table WT is achieved by use of two four-bar mechanisms 301 and 302. These replace the elongate member 110 and slide 120 of the limiter 100.

The first four-bar mechanism 301 includes of a first pair of elongate arms 310, 315 of equal length which are attached between the substrate table WT and a joining member 340. The first pair of elongate arms 310, 315 are pivotably attached at each end and the separation distance between their attachment portions on the substrate table WT and on the joining member 340 are equidistant such that the elongate arms 310, 315 always remain parallel.

The second four-bar mechanism 302 includes a second pair of elongate arms 320, 325 of equal length. The second pair of elongate arms 320, 325 are attached at one end to the joining member 340 and at another end fixedly in relation to the stator 10 on a platform 330. Again, the ends of the second pair of arms 320, 325 are rotatably fixed equidistant from each other at each end.

The first arm 310 of the first pair of arms and the first arm 320 of the second pair of arms are pivoted about the same point on the joining member 340. However, the arms 310, 320 may pivot at different positions on the joining member 340.

The positioning of the ends of the elongate arms and the fact that both of the first pair of arms are the same length and that both of the second pair of arms are the same length means that when the substrate table WT moves the substrate table WT will be constrained in its rotation about the Z-axis by the mechanical limiter 300. If a wider range of rotation is required, the platform 330 may be attached to an actuator (i.e. actuator 20) such that a larger range of motion of the substrate table WT is possible.

While specific embodiments of the invention have been described above, it would be appreciated that the invention may be practiced otherwise than as described. The description is not intended to limit the invention.

What is claimed is:

1. A lithographic projection apparatus, comprising:
   a radiation system constructed and arranged to provide a projection beam of radiation;
   a support structure constructed and arranged to support a patterning device, the patterning device constructed and arranged to pattern the projection beam according to a desired pattern;
   a substrate table to hold a substrate;
   a projection system constructed and arranged to project the patterned beam onto a target portion of the substrate;
   a planar magnetic positioning device constructed and arranged to position the substrate table at a plurality of positions in a plane; and
   a mechanical limiter constructed and arranged to limit rotation of the substrate table about axes orthogonal to the plane.

2. A lithographic projection apparatus according to claim 1, wherein the mechanical limiter allows the substrate table to rotate up to 10° around the axes before limiting rotation of the substrate table about the axes.

3. A lithographic projection apparatus according to claim 1, wherein the mechanical limiter allows the substrate table to rotate up to 5° around the axes before limiting rotation of the substrate table about the axes.

4. A lithographic projection apparatus according to claim 1, wherein the mechanical limiter allows the substrate table to rotate up to 3° around the axes before limiting rotation of the substrate table about the axes.

5. A lithographic projection apparatus according to claim 1, wherein the substrate table is positionable at the plurality of positions by the planar magnetic positioning device in the plane substantially without interference from the mechanical limiter.

6. A lithographic projection apparatus according to claim 1, wherein the mechanical limiter engages with the substrate table at at least two positions.

7. A lithographic projection apparatus according to claim 1, wherein the mechanical limiter allows the substrate table substantially the same amount of rotation around the axes irrespective of the position of the substrate table.

8. A lithographic projection apparatus according to claim 1, wherein the mechanical limiter is attached at one end to the substrate table and at another end to an actuator moveable with one degree of freedom in the plane relative to the planar magnetic positioning device.

9. A lithographic projection apparatus according to claim 8, wherein the mechanical limiter comprises an elongate member and a sleeve slidable along the elongate member in the elongate direction and partly surrounding the elongate member, one of the elongate member and sleeve attached to the actuator and the ocher of the elongate member and sleeve attached to the substrate table.

10. A lithographic projection apparatus according to claim 8, wherein the mechanical limiter comprises at least one pair of crossed elongate arms pivoted relative to each other at a median pardon of each of the crossed elongate arms.

11. A device manufacturing method, comprising:
    providing a substrate that is at least partially covered by a layer of radiation-sensitive material;
    holding the substrate on a substrate table;
    positioning the substrate table in a plane at a position selected from a plurality of positions using a planar magnetic positioning device;
    providing a projection beam of radiation using a radiation system;
    using a patterning device to endow the projection beam with a pattern in its cross-section;
    projecting the patterned beam at radiation onto a target portion of the layer of radiation-sensitive material; and
    limiting rotation of the substrate table about axes orthogonal to the plane using a mechanical limiter.

12. A method according to claim 11, wherein limiting rotation occurs after the substrate table has rotated by more than 10°.

13. A lithographic projection apparatus according to claim 1, wherein the mechanical limiter comprises first and second four-bar mechanisms, the first four-bar mechanism connected at a first end to the substrate table and at a second end to a joining member, and the second four-bar mechanism being connected at a second end to the joining member and at a first end to a member if the plane of the planar magnetic position device.

14. A method according to claim 11, wherein the mechanical limiter allows the substrate table to rotate up to 5° around the axes before limiting rotation of the substrate table about the axes.

15. A method apparatus according to claim 11, wherein the mechanical limiter allows the substrate table to rotate up to 3° around the axes before limiting rotation of the substrate table about the axes.

16. A method according to claim 11, wherein the substrate table is positionable at the plurality of positions by the planar magnetic positioning device in the plane substantially without interference from the mechanical limiter.

17. A method apparatus according to claim 11, wherein the mechanical limiter engages with the substrate table at least two positions.

18. A method according to claim 11, wherein the mechanical limiter allows the substrate table substantially the same amount of rotation around the axes irrespective of the position of the substrate table.

* * * * *